United States Patent [19]

Appleby

[11] Patent Number: 4,643,817
[45] Date of Patent: Feb. 17, 1987

[54] PHOTOCELL DEVICE FOR EVOLVING HYDROGEN AND OXYGEN FROM WATER

[75] Inventor: A. John Appleby, Mountain View, Calif.

[73] Assignee: Electric Power Research Institute, Inc., Palo Alto, Calif.

[21] Appl. No.: 742,476

[22] Filed: Jun. 7, 1985

[51] Int. Cl.$^4$ .................... C25B 1/04; C25B 9/00
[52] U.S. Cl. .................... 204/242; 204/129; 204/278; 204/DIG. 3; 136/249; 429/111
[58] Field of Search ............... 136/249 TJ; 429/111; 204/129, 242, 278, DIG. 3, 157.15, 157.40, 157.52

[56] References Cited

U.S. PATENT DOCUMENTS 4,272,641  6/1981  Hanak .................. 136/249 TJ
4,381,233  4/1983  Adachi et al. .............. 204/242
4,387,265  6/1983  Dalal ................... 136/246 TJ
4,466,869  8/1984  Ayers ................. 204/157.1 R

FOREIGN PATENT DOCUMENTS 55-111180  8/1980  Japan .................. 136/249 TJ
59-105379  6/1984  Japan .................. 136/249 TJ Primary Examiner—Aaron Weisstuch
Attorney, Agent, or Firm—Flehr, Hohbach, Test, Albritton & Herbert

[57] ABSTRACT

A photocell device for evolving hydrogen and oxygen from water using solar radiation is formed with a plurality of p-n junctions. A transparent ohmic window is disposed at the p-n junctions to avoid lattice mismatch and to provide maximized equal current densities in each layer of the plurality of p-n cells.

5 Claims, 4 Drawing Figures

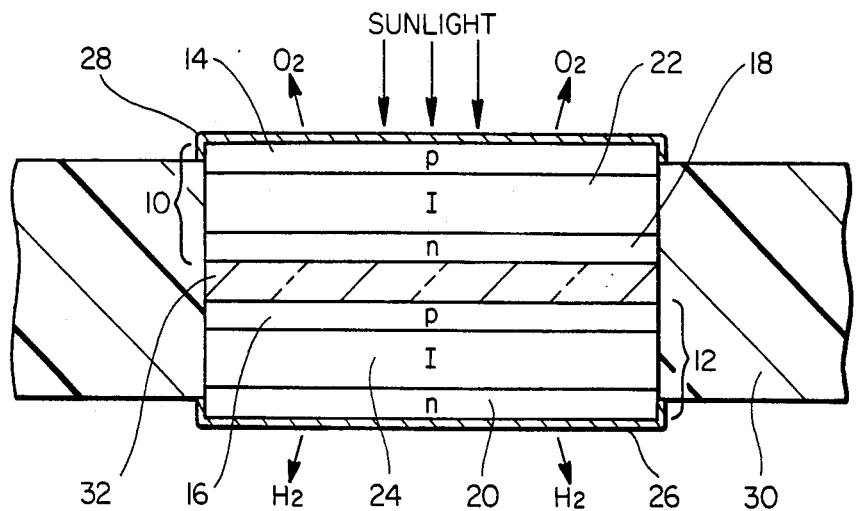
FIG_1
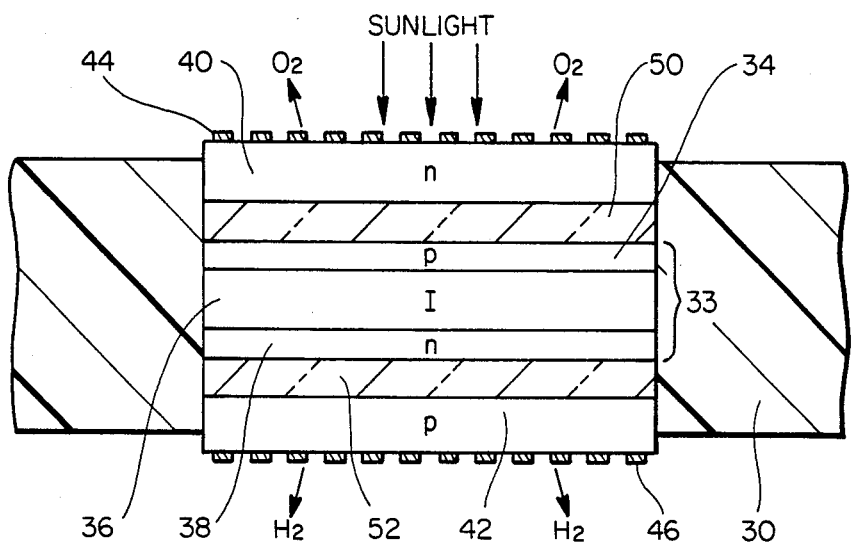
FIG_2

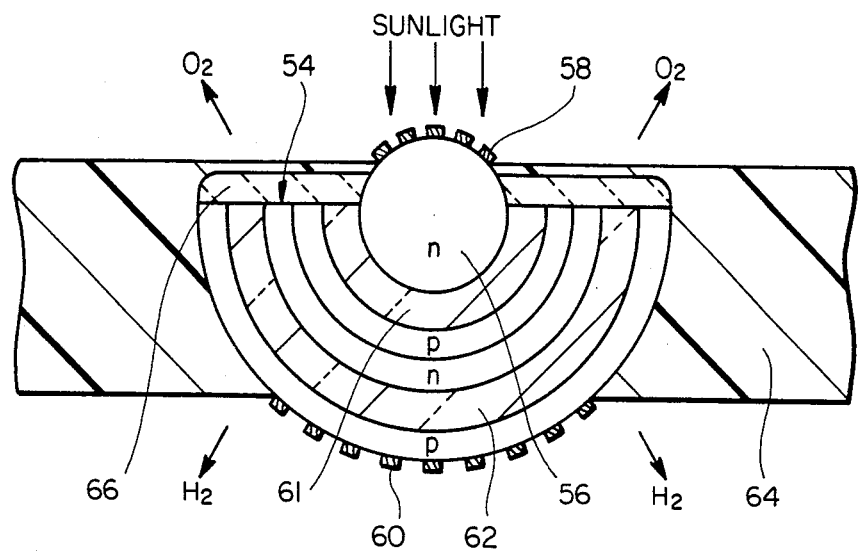
FIG_3
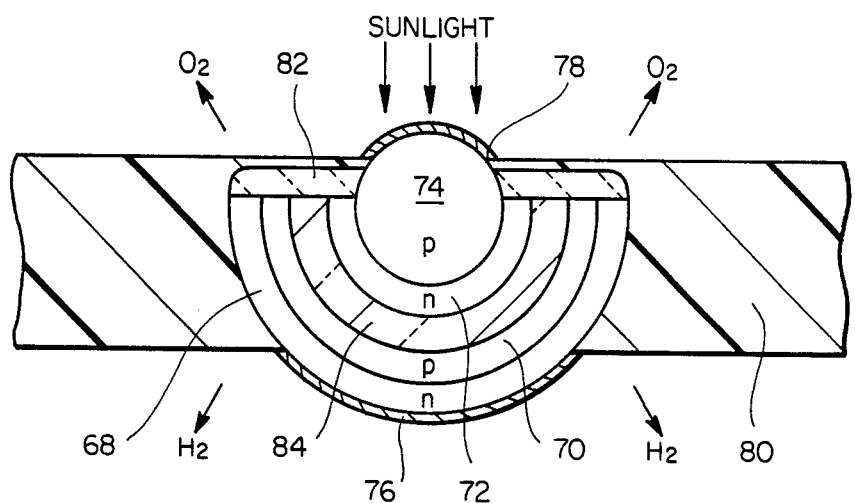
FIG_4

PHOTOCELL DEVICE FOR EVOLVING HYDROGEN AND OXYGEN FROM WATER

DESCRIPTION

1. Technical Field

This invention relates to a photocell device for evolving hydrogen and oxygen from water using solar radiation.

2. Background of the Invention

To overcome the dependence on oil as a major source of energy, there has been a continuing effort to use other sources of energy, such as solar radiation, wind, geothermal energy and the like. Solar radiation is a prime candidate because it is generally predictable, constant and available virtually all over the earth. In recent experiments, solar radiation has been used to activate photoelectrochemical devices which can effectively separate hydrogen and oxygen from water.

Hydrogen is widely used in industrial processes, such as a reducing agent, by way of example. There are several methods employed for the production of hydrogen. Generally, large amounts of power are necessary for such production methods and the cost of energy as well as materials used to yield hydrogen is relatively high.

As mentioned above, it has been recently discovered that hydrogen and oxygen can be produced by photoelectrochemical processes which effectively separate these elements from water. Photoelectrochemical devices which are immersed in an aqueous electrolyte can develop sufficient potentials to decompose water when radiation is applied to the system. Since solar radiation is readily available at virtually no cost, this source of radiation energy can be used to activate the photocell system to obtain the level of potential necessary to implement the process of evolving hydrogen and oxygen from water.

In an article in the *Journal of Electroanalytical Chemistry*, Volume 58, page 263 (1975), Gerischer describes a theoretical approach to the process. It is believed that band bending at the semiconductor/electrolyte interface, as the Fermi level in the semiconductor reaches equilibrium with the effective free energy of electrons in the electrolyte, occurs in a darkened environment. However, under illumination, the nonequilibrium electrons that are released to the conduction band give rise to an effective Fermi level shift which is capable of driving an electrochemical process. According to the theory expounded by Gerischer, n-type semiconductors will participate in anodic or oxidative processes, and p-type in cathodic or reductive processes. Thus theoretically a semiconductor of each type when electrically shorted together and immersed in aqueous electrolyte can decompose water under illumination, provided that the potentials developed are sufficient to decompose water. The theoretical potential for water decomposition is 1.23 volts, but from a practical viewpoint at least 1.5–2.0 volts are required. For this purpose wide gap semiconductors are needed, but such structures suffer from low efficiency.

In an article in the Bulletin of the *Chemical Society of Japan*, Volume 44, page 1148 (1971), also found in the publication of *Nature*, Volume 238, page 37 (1972), Fujishima and Honda discuss the aspects of theories applicable to the separation of hydrogen and oxygen from an aqueous solution. Fujishima and Honda describe the use of titanium oxide on a surface of metal to achieve the desired water decomposition. However titanium oxide is a poor semiconductor and absorbs the short wavelength portion of the spectrum. Therefore titanium oxide is inefficient to separate oxygen from water and operates at about a one percent efficiency.

In order to obtain the high voltage necessary to decompose water at high efficiency, one n-semiconductor/electrolyte junction of the Gerischer type (*Journal of Electroanalytical Chemistry*, Volume 58, page 263, (1975)) may be combined with one p-semiconductor/electrolyte junction so that the voltages thus developed are additive. For example, one p-type semiconductor in contact with an aqueous solution developing a photovoltage of $-0.8$ volts may be made to evolve hydrogen from the aqueous solution, if it is connected electronically to an n-type semiconductor in the same solution, which develops a semiconductor electrolyte voltage of $+0.8$ volts. The n-type semiconductor will then evolve oxygen since the total voltage generated by the system is 1.6 volts. However, in order to develop 0.8 volts of photopotential, high band gap semiconductors are necessary. Since they can only absorb the short wavelength part of the solar spectrum, which constitutes only a small part of the total available solar energy, they will possess very low efficiencies. Thus in order to obtain higher efficiencies, it would be advantageous to use three or more photosensitive junctions of smaller bandgap so that each will more efficiently convert the solar spectrum to electricity. For example, it is possible to use one p-semiconductor/electrolyte Gerischer junction connected electronically to a photovoltaic junction cell, which is in turn connected electronically to an n-semiconductor/electrolyte junction so that the voltages developed are additive.

The p-semiconductor/electrolyte and n-semiconductor/electrolyte junctions can be advantageously protected from total attack and made into catalytic surfaces for hydrogen and oxygen evolution respectively by the use of suitable protective and/or catalytic layers, which do not interfere by the photoelectrochemical properties of the semiconductor electrolyte junction. For example, islands of platinum deposited on a p-type silicon semiconductor surface catalytically aids the evolution of hydrogen, whereas transition metal oxide layers or platinum doped silicon dioxide layers produced by anodizing platinum deposition and heat treatment protect an n-type silicon surface and materially aids oxygen evolution.

An alternative approach is to use three solid state p-n junction cells connected electrically in series to develop the necessary voltage to decompose water. In this case if the high voltage and low voltage surfaces make an ohmic junction with the electrolyte, there will be no formation of interfering junctions of the Gerischer type and the external surfaces, if suitably catalyzed, can evolve hydrogen and oxygen from an electrolyte. In such cases, hydrogen will be evolved on the external n-type surface and oxygen will be evolved on the p-type surface. Prior art structures employ cells that are connected optically in parallel and electrically in series. It would be clearly advantageous for better utilization of the sun's energy if the cells can be connected optically in series so that the whole solar spectrum can be utilized in a system that can evolve hydrogen and oxygen from water.

A more recent description of the photolytic production of hydrogen is set forth in U.S. Pat. No. 4,466,869 issued to William Ayers, wherein a photoelectrode having a plurality of stacked photovoltaic elements connected optically and electrically in series disposed between two surfaces serving as electrodes provide a structure separating hydrogen and oxygen from an aqueous electrolyte. Ayres proposes a process in which an aqueous electrolyte is maintained in contact with an anodic surface and a cathodic surface, wherein the anodic or cathodic potentials are maintained by the stacked photovoltaic array. The array is illuminated to evolve hydrogen at the cathode (the n-type catalyzed surface), and oxygen is evolved at the anode (the p-type catalyzed surface).

An undesirable phenomenon that occurs in the process is when the electrons and holes become mobile, there is a tendency for electrons to be trapped at the interfaces between individual stacked photovoltaic cells, which results in a recombination of the electrons and holes. Consequently, there is a loss of the electron energy that would be available for the separation of water into hydrogen and oxygen. Therefore, the process suffers from low efficiency which makes the process not economically feasible. In order to overcome this problem of low efficiency, suitable materials need to be used in a structural arrangement in which this recombination is minimized.

SUMMARY OF THE INVENTION

An object of this invention is to provide a photocell for evolving hydrogen and oxygen from water with increased efficiency.

Another object of this invention is to provide a photocell system that enables the separation of hydrogen and oxygen from water at reduced cost.

In accordance with this invention, a photocell system for evolving hydrogen and oxygen from water comprises a plurality of photocells in a stack or array providing at least two p-n or p-I-n junctions or one n-electrolyte junction, at least one p-n or p-I-n junction, and one p-electrolyte junction. The cells include a porous membrane, disposed between the external electrode surfaces of the stack or array that allows passage of ions to complete the electric circuit and prevents recombination of hydrogen and oxygen. Transparent ohmic window layers are formed respectively between all n and p-n or p-I-n type layers to avoid lattice mismatch and to allow the advantageous use of chemically different semiconductors and thus obtain optimum charge carrier energy and lifetime characteristics for highest solar efficiency for hydrogen and oxygen production.

BRIEF DESCRIPTION OF THE DRAWINGS

The invention will be described in detail with reference to the drawing in which:

FIG. 1 is a schematic representational view of a photocell device, made in accordance with this invention;

FIG. 2 is a schematic representational view of an alternative structure embodying this invention;

FIG. 3 is a configuration of a photocell device using spherical cells, in accordance with this invention; and FIG. 4 is an alternate configuration of a photocell device using spherical cells.

DESCRIPTION OF THE INVENTION

With reference to FIG. 1, a photovoltaic device illuminated on its upper surface, useful for separating water into hydrogen and oxygen gases, includes at least two thin photovoltaic cells 10 and 12, each including respectively a p-type conductivity layer 14, 16, an n-type conductivity layer 18, 20, separated by an intrinsic (I) semiconductor layer 22, 24. The bottom cell can be a p-n system instead of a p-I-n system. The bottom n-type layer 20 is first deposited on a thin aluminum foil (not shown) which serves as a support base for deposition for the successive layers. The aluminum foil is removed by dissolution in a diluted potassium hydroxide solution, for example, after the structure of FIG. 1 has been assembled. Prior to deposition of the p-I-n cells, a thin coherent layer of platinum 26 of about 7-8 nanometers is sputter deposited on the aluminum foil. In addition, a thin film of platinum 28 is sputter deposited on the upper p layer 14.

In one embodiment, the n and p type layers are basically made of amorphous silicon, with dopants to provide the desired charge carrier properties so that the upper cell 10 is of high gap, and converts the short wavelength part of the solar spectrum to electricity, and the lower cell 12 is of lower gap, converting the longer wavelength part to electricity, the properties of layers being arranged so that their current densities are equal and at a maximum value for optimum efficiency. The layers are deposited in a plasma environment, to a thickness for each p-I-n cell of about 400 nanometers, as is known in the art and described in U.S. Pat. Nos. 4,226,898 and 4,217,374. Each p layer 14, 16 is heavily doped and is deposited to a thickness of about 10-40 nanometers; each intrinsic semiconductor layer 22, 24 is about 100-400 nanometers; and each heavily doped n-type layer 18, 20 is about 10-40 nanometers in thickness.

To prevent mixing of hydrogen and oxygen produced, a thin transparent membrane 30 made of a porous material, such as polyvinyl chloride (PVC) is formed to attach to the cell structures, as illustrated. The membrane allows the passage of protons necessary for the chemical reaction to split water into the hydrogen and oxygen gases.

In accordance with this invention, a transparent ohmic window 32 made for example of tin oxide is formed between the cells 10 and 12. The ohmic window effectively avoids lattice mismatch between the p layer 16 and n layer 18, which would tend to reduce the efficiency of the photovoltaic cell structure. The tin oxide window 32 is deposited by sputtering or electrodeposition to a thickness of about 400 nanometers.

In operation, the structure including the photovoltaic cells 10 and 12 is placed in an aqueous electrolyte, such as dilute acid or alkali. Upon the application of light, designated by arrows, which preferably is solar radiation, a chemical reaction is initiated. The thin platinum layers 26, 28 serve as catalysts and a high electrode potential difference is generated by the multiple junctions so that current flows within the aqueous electrolyte. The luminous energy is absorbed by the stacked cells 10, 12 which are optically coupled in series. As a result, hydrogen and oxygen gases evolve from the electrolyte at the photoelectrodes, constituted by the cathodic photoelectrode of cell 12 at which hydrogen is generated, and the anodic photoelectrode of cell 10 at which oxygen is generated.

The open circuit voltage developed with two p-I-n stacks of the type depicted in FIG. 1 has been found to be at least 1.4 volts, and a single p-I-n cell was measured at about 0.85 volts. When a three cell structure is used, a total voltage of about 2.4 volts was obtained.

In a second embodiment, shown in FIG. 2, a photovoltaic cell 33 illuminated from the upper side consists of a p-type layer 34, an I layer 36, and an n-type layer 38. The p-I-n cell, which has a medium bandgap, is disposed substantially centrally between a high bandgap n-type layer 40 and a low bandgap p-type layer 42, so that their current densities are equal and at a maximum value for optimum efficiency. The medium bandgap for the photovoltaic cell 33 is about 1.7 electron volts, whereas the high bandgap layer 40 is about 2.0 electron volts, and the low bandgap layer 42 is about 1.45 electron volts.

Catalyst islands 44 of platinum are formed by electrodeposition on top of the n-type layer 40 to which light is directed during utilization of the photovoltaic cell structure when immersed in aqueous electrolyte. The n-surface carrying the platinum islands is anodized or otherwise oxidized to provide a protected catalytic surface for oxygen evolution, but any geometry may be used that serves to provide the catalytic action. Catalysts islands 46 of platinum are also provided on the bottom surface of the low bandgap p-type layer 42, which evolves hydrogen. A porous ion-conducting membrane 30 is formed and coupled to the photovoltaic structure, as described with reference to FIG. 1.

To build the structure, an acetate base (not shown) is used to support a formation of the catalysts islands 46. On completion of the photovoltaic assembly, the acetate is dissolved so that the catalytic layer is exposed.

In one embodiment of the photovoltaic cell assembly of FIG. 2, the thicknesses of the high gap n-type layer 40 and of the low gap p-type layer 42 are about 100–400 nanometers, and the p-I-n cell 32 is 400 nanometers or less in thickness.

A feature of this invention is the provision of ohmic transparent windows 50 and 52, made of thin layers of transparent tin oxide, which act to prevent lattice mismatch and allow the use of chemically different semiconductors for optimum efficiency. The windows 50 and 52 are deposited by plasma deposition between each active photo-junction layer. As a result, the efficiency of the splitting of water into hydrogen oxygen gases is significantly increased to greater than 10%.

To obtain the high bandgap, amorphous silicon-germanium alloys may be used, and amorphous silicon-tin alloys may be used for the low bandgap layer. Amorphous silicon alloys are preferred for the medium gap cell 32.

With reference to FIG. 3, a spherical type photovoltaic structure, such as described in U.S. Pat. No. 4,021,323, is illustrated. A multiple spherical assembly may be made in accordance with the description of the patent, which is hereby incorporated by reference.

In accordance with this invention, an n-Schottky photovoltaic assembly is formed with a p-n-p cell 54 and a central n-type spherical portion 56. Catalytic islands of platinum 58 are deposited on the n-type portion 56 and platinum islands 60 are formed on the outer p layer of the cell 54. A porous membrane 64 is formed adjacent to the p-n-p cell to prevent recombination. Transparent ohmic contacts 61 and 62 of tin oxide are fabricated between the p-n junctions, in accordance with this invention, to overcome the lattice mismatch problem, as described above.

The spherical cell structures are selectively etched to provide a relatively flat surface for deposition of glass frit to form a top glass layer 66 to which light is directed when the photovoltaic assembly is disposed within an aqueous electrolyte. The p-n junctions of the spherical configurations are activated by total internal reflection, using spherical glass optics.

An alternative spherical type configuration is illustrated in FIG. 4 wherein an n-p-n-p junction device has an n layer 68, p layer 70, n layer 72 and central p layer 74. A continuous platinum catalyst section 76 is disposed about a portion of the n-type layer 68, and a platinum catalyst section 78 is formed on a portion of the central p-type layer 74. A porous membrane 80 is provided with the assembly and a glass layer 82 is formed on the truncated spherical cell. In accordance with a feature of this invention a transparent ohmic window 84 is formed between the central n-p junction, to avoid the lattice mismatch problem.

There has been described herein photovoltaic devices useful for splitting water into hydrogen and oxygen gases in response to light energy. In order to solve the problem of lattice mismatch between chemically different semiconductors which would significantly reduce the efficiency of the devices, transparent ohmic windows are provided at the p-n junctions. As a result, the efficiency of the photovoltaic cells are substantially improved.

It should be understood that the scope of the invention is not limited to the specific materials and parameters recited herein. The transparent windows may be made of indium tin oxide, as well as tin oxide, for example. The catalyst material may be a transition metal oxide taken from Group VII or Group VIII of the Periodic Table, instead of platinum. Deposition may be made by electrodeposition or the dry process of sputtering. Other modifications may be made in keeping with this invention.

What is claimed is:

1. A photovoltaic assembly useful for splitting water into hydrogen and oxygen gases, comprising:
    a p-I-n type photovoltaic cell having a p-type conductivity layer, an intrinsic semiconductor layer, and an n-type conductivity layer formed to provide a medium bandgap cell;
    a high bandgap n-type layer disposed above said p type layer of said photovoltaic cell and adapted to contact an electrolyte including water;
    a low bandgap p-type layer disposed below said n type layer of said photovoltaic cell and adapted to contact an electrolyte including water; and
    transparent ohmic window layers formed between the p and n layers of said photovoltaic cell and the high bandgap and low bandgap layers.

2. A photovoltaic assembly as in claim 1, wherein said p-I-n cell is about 400 nanometers or less in thickness, and the high gap n-layer and low gap p-layer are about 100–400 nanometers in thickness.

3. A photovoltaic assembly useful for splitting water into hydrogen and oxygen gases, comprising:
    a plurality of stacked p-I-n type photovoltaic cells, each cell having a p-type conductivity layer, an intrinsic semiconductor layer and an n-type semiconductor layer, wherein, the bandgap of each cell decreases from the illuminated top cell to the nonilluminated lowest cell and wherein adjacent cells are ohmically interconnected in series by means of a transparent conductive layer and the uppermost p type layer and the lowermost n type layer are adapted to contact an electrolyte including water.

4. A photovoltaic cell assembly useful for splitting water into hydrogen and oxygen gases comprising:

a spherical type structure having a plurality of concentric n-p or p-n type layer pairs in that order; and a transparent ohmic window formed at the junction between adjacent n-p or p-n layer pairs.

5. A photovoltaic cell assembly useful for splitting water into hydrogen and oxygen gases, comprising:

a photovoltaic cell having at least two p-n type conductivity semiconductor layer pairs formed in a concentric spherical type configuration, the n-type layer of one of said pairs being at the center of said spherical type configuration; and transparent ohmic windows formed in each p-n layer pair of said cell between the p and n conductivity type layers of each said pair.

* * * * *